United States Patent [19]

Frerking et al.

[11] 4,396,892
[45] Aug. 2, 1983

[54] ACCELERATED WARM-UP CRYSTAL OVEN

[75] Inventors: Marvin E. Frerking, Cedar Rapids; Glenn R. Hykes, Hiawatha, both of Iowa

[73] Assignee: Rockwell International Corporation, El Segundo, Calif.

[21] Appl. No.: 226,974

[22] Filed: Jan. 21, 1981

[51] Int. Cl.³ .......................... H03B 5/32; H03L 1/04
[52] U.S. Cl. ..................................... 331/69; 219/210; 331/176
[58] Field of Search ........................... 331/69, 70, 176; 310/315; 219/210

[56] References Cited

U.S. PATENT DOCUMENTS 3,158,821 11/1964 Sulzer ..................................... 331/69
3,550,006 12/1970 Harner ............................. 331/69 X
4,317,985 3/1982 Wilson ................................ 219/210

Primary Examiner—Siegfried H. Grimm
Attorney, Agent, or Firm—Richard K. Robinson; Howard R. Greenberg; H. Fredrick Hamann

[57] ABSTRACT

Temperature stability is quickly achieved for a crystal oscillator mounted in a warm-up crystal oven because the heat is applied proportionally to the mass of the oscillator and circuitry during the initial warm-up period of time and then applied proportionally to the area that will allow compensation for thermal loss after the warm-up period. The oscillator crystal is encapsulated within a case along with an oscillator circuit for the oscillator crystal that is thermally mounted to the case. A controlled heater heats the warm-up crystal oven and crystal oscillator. The controlled heater is controlled by a temperature controller that responds to a first thermal sensor that senses the temperature of the case and a second thermal sensor that senses the temperature of the controlled heater.

8 Claims, 7 Drawing Figures

ACCELERATED WARM-UP CRYSTAL OVEN

BACKGROUND OF THE INVENTION

This invention relates to crystal oscillators mounted within temperature controlled ovens.

The use of oven mounted crystal oscillators is well known in the prior art and their operation has been somewhat successful especially after the oscillator has achieved stabilization. Separate heaters including heaters whose resistance is distributed proportionally to the mass of the oscillating crystal have been used during warm-up. The crystal and heaters are placed in a Dewar flask for insulation along with the temperature sensors which are placed in positions that represented the average crystal temperature modified by the temperature transient effects of the crystal.

SUMMARY OF THE INVENTION

In the prior art system, although efforts were made to compensate for the temperature gradiants across the oven assemblies by judiciously placing the thermistor temperature sensors, it was generally held that with selective placement of the sensors, the warm-up time for a crystal oscillator to stabilize would be a minimum of aproximately 5 minutes. Unfortunately, the prior art crystal oscillators could not be easily manufactured because minute changes in the thermal structure made the above defined approach impractical because the optimum sensor placement of the heaters and/or sensors would vary from unit to unit.

Temperature stability is quickly achieved for a crystal oscillator mounted in an insulated crystal oven when the heat is applied proportionally to the mass of the oscillator and circuitry during an initial warm-up period and then applied only to compensate for thermal loss after the warm-up period. Temperature stabilization is accelerated by an improved sensing means consisting of two thermistors and two heating elements. One heating element is selected and placed in a location that will not produce rapid heating. The heating element is properly controlled to prevent a temperature overshoot. The other heating element is selected and placed in a location which will, under normal operation, produce a temperature undershoot. By adjusting the degree of control each thermistor has on the control circuit that drives the heating elements, stabilization can be optimized on every unit despite minor differences in the mechanical assembly.

Two thermistor locations are chosen, one of which is certain, if used alone, to cause the heating elements to produce a positive frequency gradient during the transitional period of initial energization of the oscillating circuit and oven, and the other, if used alone, would cause the heating elements to produce a negative frequency gradient. The two thermistors are placed electrically in series and a calibrated resistance is placed across the more sensitive of the two thermistors. By the proper selection of the resistance, through the adjustment of a variable resistor, it is possible to ideally damp every production unit so that the warm-up stabilization time is in the two to three minutes region.

Many advantages of the present invention may be ascertained from a reading of the specification and the claims in conjunction with the drawings.

DETAILED DESCRIPTION OF THE PREFERRED EMBODIMENT

Figure 1:
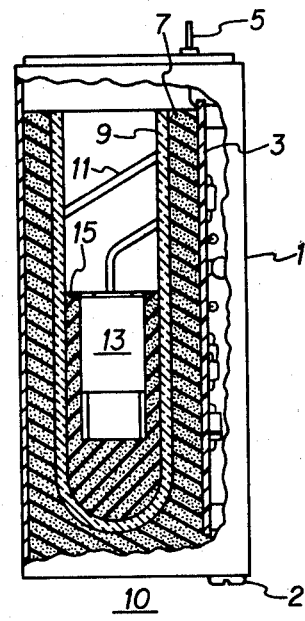
FIG. 1 is a crystal oscillator and circuitry mounted in an oven heater according to the invention.

In FIG. 1 there is shown an oven mounted crystal oscillator 10 which includes an outside metal case 1 which for illustration purposes has its sides cut away. Inside the metal case 1, there is a printed circuit board 3 for mounting of electrical components which is electrically connected to the outside of the metal case 1 by means of the feedthrough pins 5. A glass Dewar bottle 9 is held in place within the metal case 1 by an insulating and shock absorbing mounting support 7 (such as synthetic foam rubber) which encapsulates the Dewar bottle 9 that contains an oscillator crystal, a temperature controlled oscillator and circuit assembly 13 that are connected to the printed circuit board 3 by means of the wiring bundle 11 illustrated in FIG. 1 as a loop of wire. The oscillator crystal, temperature controlled oscillator and circuit assembly 13 are held in place within the Dewar bottle 9 by means of a mounting material 15 which in the case of the preferred embodiment is a synthetic foam rubber.

Figure 2:
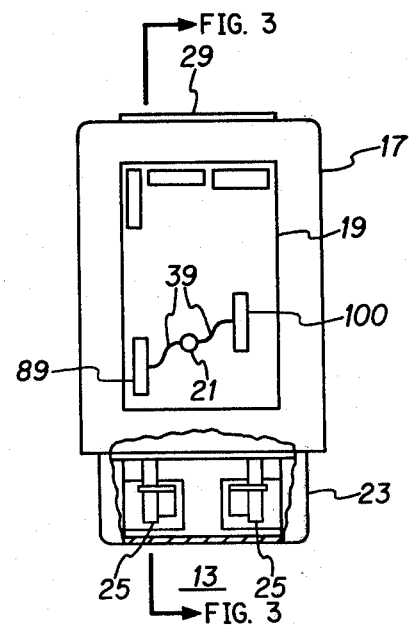
FIG. 2 is a diagram illustrating the placement of one thermistor on the crystal oscillator and circuitry according to the invention.

The oscillator crystal, temperature controlled oscillator and circuit assembly 13 (hereafter referred to as the circuit assembly 13) are shown in FIG. 2 to which reference should now be made. The oscillating crystals used in crystal oscillators as illustrated in FIG. 2 are normally enclosed in metal cans or crystal cases such as the industry standard HC-36/U or TO-8 assembly. Surrounding the crystal cases is a heat conductor 17 such as a copper case and bonded to the copper case are ceramic printed circuits 19 and 29. The ceramic printed circuit 19 has printed on it the heating elements used to heat the oscillator crystal. The leads 39 are connected between a temperature sensor 21, which is a device such as a thermistor, and a heater printed circuit board 19. The temperature sensor 21 measures the temperature of the heating elements and the oven assembly. This results in this sensor being the sensor that monitors the heating source causing, in the Prior Art unit, premature shut-off of the heating elements, and thus, frequency undershoot.

As used herein, undershoot means the oscillator produces an output frequency that is less than the desired output frequency and overshoot means that the output frequency is greater than the desired output frequency.

At the base of the circuit assembly 13 is a pin assembly 23 which shields pins 25 that are used to interface the oscillator circuit to the crystal contained within the heat conductor 17. The ceramic printed circuit 29 provides a termination connection for the wiring bundle 11.

Figure 3:
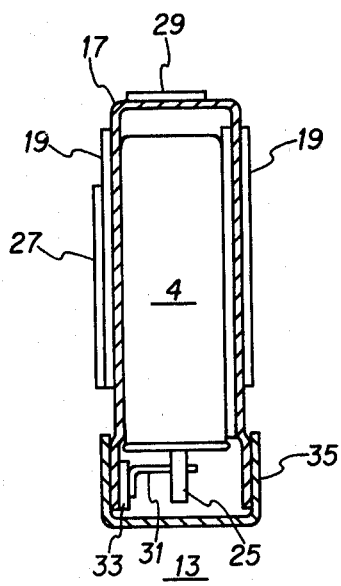
FIG. 3 is a side view of the crystal oscillator and circuitry and heating units according to the invention.

FIG. 3 is another view of the circuit assembly 13 as seen from section lines 3 and in which there is shown a crystal case 4 encapsulated by the heat conductor 17. Bonded to each surface of the heat conductor 17 is the ceramic printed circuit 19 on which the heating elements are etched. A ceramic printed circuit 27 is mounted to one of the ceramic printed circuits 19 and contains the oscillating circuit that is connected across the crystal oscillator by means of the conductor 31 and the pins 25. The conductor 31 is a copper strip which in order to accelerate heating of the crystal is terminated to a ceramic pad 33 and the whole assembly is shielded by a pin assembly heat shield 35. The ceramic printed circuit 29 is affixed to the top of the circuit assembly 13 and facilitates the connection between the heating elements and the printed ceramic circuit 19 and the components on the ceramic printed circuit assembly 27.

Figure 4:
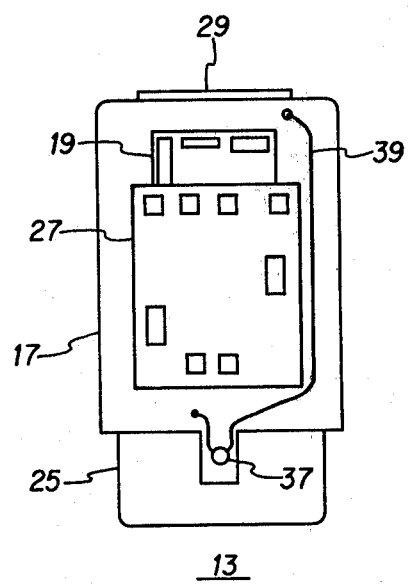
FIG. 4 illustrates the placement of the second thermistor on the crystal oscillator and circuitry.

The ceramic printed circuit assembly 27 is illustrated more clearly in FIG. 4 in which there is shown an enlarged side view of the circuit assembly 13. There is a second temperature sensor 37 mounted over the pin assembly 25 which is connected to the ceramic printed circuit assembly 29 by means of the lead 39. The location of ceramic printed circuit assembly 27 is selected to compensate for the fact that not only is the crystal sensitive to variation in the temperature, but also the oscillating circuit, and as such in the preferred embodiment it has been found that superior results are achieved when the oscillator circuit is maintained (through location of the ceramic printed circuit assembly 27) at approximately the same temperature as the oscillator crystal. Temperature sensor 37 is placed over the heat shield 35 and monitors the area which can result in frequency undershoot if only one temperature sensor were used.

Figure 5:
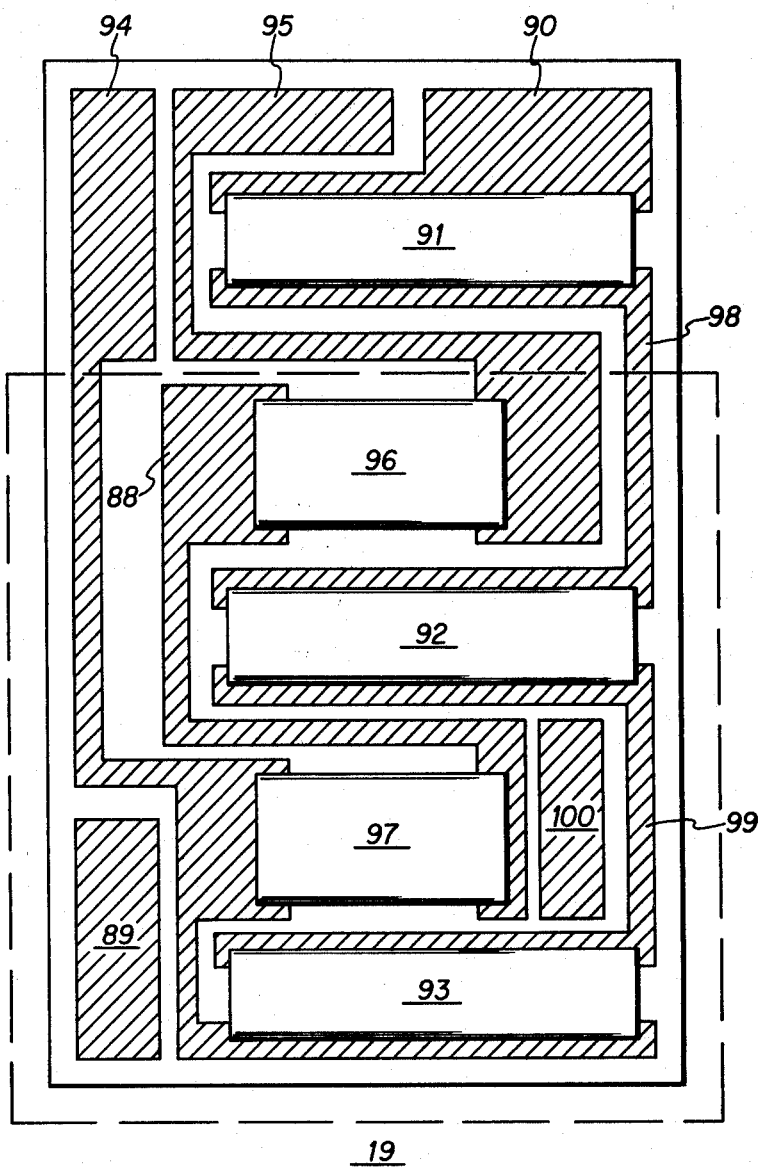
FIG. 5 is a layout of the heating elements according to the invention.

A layout of the heater assembly ceramic printed circuit card 19 is shown in FIG. 5. The high heat elements consist of three series connected resistive elements 91, 92 and 93 that are joined together by the conductors 98 and 99 with the input voltage being applied across conductor 90 and the return conductor 94. The low heating elements consist of two series connected resistive elements 96 and 97 which are more massive than the high heat elements and are joined together by conductor 88. The series combination of resistive elements 96 and 97 and conductor 88 is connected across conductors 95 and 94. Both pads 89 and 100 are used as electrical termination for the thermistor 21.

Figure 6:
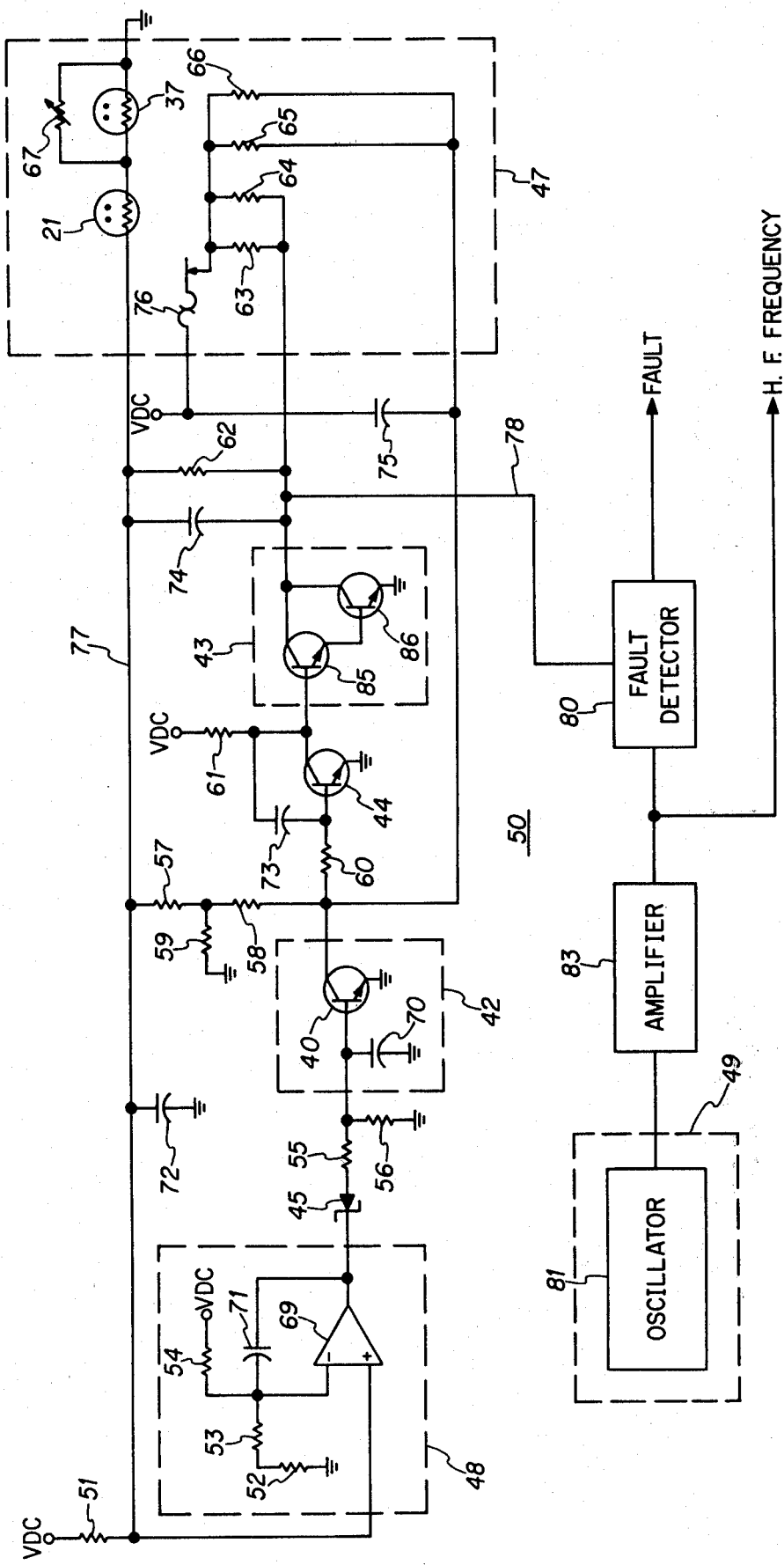
FIG. 6 is a schematic diagram of the crystal oscillator and circuitry with the control circuitry for controlling the temperatures of the heaters according to the invention.

FIG. 6 is a schematic diagram of the thermal controlled crystal oscillator circuit and provides for an oscillator 81 that, as indicated by dotted lines 49, is mounted within the heater assembly and includes the circuit elements contained on the ceramic printed circuit assembly 27 as well as the crystal that is contained within the case 4. The output of the oscillator is amplified by the amplifier 83 which in the preferred embodiment is mounted on the printed circuit board 3. A fault detector 80 is used to indicate when either the heating assembly or the oscillator 81 or amplifier 83 are not functioning properly. A heating control circuit 50 provides a means for controlling the heat from the heaters that are indicated as resistors 63, 64 and resistors 65 and 66. Resistor 63 or 64 consists of the high heat resistor elements 91, 92 and 93 shown in FIG. 5. There are two heating elements mounted across the oscillating crystal. Resistor 63 represents the series connected resistive elements 91, 92 and 93 that are mounted on the one side of the crystal assembly 13. In a similar manner, resistors 65 or 66 consists of the series connected resistive elements 96 and 97 (the maintenance heat element) as shown in FIG. 5. Resistors 64 and 65 are mounted on opposite sides of the circuit assembly 13. The comparator 48 consists of an operational amplifier 69 having a filter capacitor 71 connected between its inverting input terminal and its output terminal. The comparator 48 compares the voltage at the junction of resistors 53 and 54 with the voltage at the junction of resistor 51 and thermistor 21. The difference is applied to a power amplifier 42 that includes a transistor 40. Biasing for the transistor 40 consists of the zener diode 45, resistors 55 and 56, and filtering is provided by capacitor 70. Resistors 57, 58 and 59 provide a feedback path for stabilization purposes around the comparator 48 and the amplifier 42. When the circuit is initialized, the resistance of the thermistors 21 and 37 is very high due to the temperature of the circuit assembly 13. Under these conditions, there will be the large positive voltage on the output of the operational amplifier 69 which will cause the amplifier and, consequently, transistor 40 to go into saturation pulling the junction of resistors 58 and 60 to approximately ground potential. This will cause the current to flow from a positive voltage DC through the fuse 76 and resistors 63 and 64 causing the resistive elements 91, 92 and 93 of the two printed ceramic circuits 19 to heat the ceramic printed circuit assembly 27 as well as the case 4 and circuit assembly 13. The transistor 44 is normally biased on by the current flow through resistors 60, 65 and 66. However, when the transistor 40 goes into saturation, transistor 44 turns off thereby causing transistor 85 to become forward biased and, consequently, transistor 86 to become forward biased in which case the current flow through these transistors and, thus, through resistors 63 and 64 provides accelerated warm-up to the circuit assembly 13. One set of resistive elements 91, 92 and 93 is represented by resistor 63 and the other set of resistive elements by resistor 64.

The collector of the transistor 44 is connected to a positive DC source through resistor 61. Capacitor 73 provides filtering so that the transistor will not turn off or on due to glitches or spurious spikes that may appear in the DC source. Resistor 62 is a feedback resistor that is across the comparator 48, the amplifier 42 as well as the amplifier 43 and sets the circuit gain during the warm-up mode. Capacitor 74 provides high frequency AC feedback around the entire amplifier and capacitor 75 provides bypassing for the collector of the transistor 40. Additional filtering is provided by capacitor 72.

As the circuit approaches a desired operating temperature that will insure stability of the output frequency from the oscillator 81, transistor 40 due to the drop in voltage on its base will come out of saturation thereby causing the transistor 44 to act as a switch and go into saturation shorting to ground the base of transistor 85 thus causing the current flow through the resistors 63 and 64 to cease. The current flow through resistors 65 and 66 is thus controlled by the amplifier 42 due to the fact that transistor 40 is now operating within the linear region as determined by the output voltage of the comparator 48.

The variable resistor 67 is placed in parallel with the thermistor 37 which is the more sensitive thermistor and is used during calibration to ensure that the circuitry functions according to specification. The variable resistor 67 thus provides electrical weighting of both thermistors 21 and 37. This alleviates the stringent requirements of selecting the appropriate place for mounting the thermistors due to minute variance in the temperature structures of assembled units and provides a single point adjustment (i.e., resistor 67), to control the temperature overshoot. The components used in the circuit of FIG. 6 are provided in Table 1.

TABLE 1

| 40 | Transistor | 2N2222 |
|---|---|---|
| 44 | Transistor Switch | 2N2222 |
| 45 | Zener Diode | 1N746 |
| 51 | Resistor | 34.8KΩ |
| 52 | Resistor | 10KΩ |
| 53 | Resistor | 10KΩ |
| 54 | Resistor | 34.8KΩ |
| 55 | Resistor | 3010Ω |
| 56 | Resistor | 20KΩ |
| 57 | Resistor | 68.1KΩ |
| 58 | Resistor | 20KΩ |
| 59 | Resistor | 200Ω |
| 60 | Resistor | 20K |
| 61 | Resistor | 10K |
| 62 | Resistor | 243K |
| 63 | Resistive Element | 30Ω |
| 64 | Resistive Element | 30Ω |
| 65 | Resistive Element | 300Ω |
| 66 | Resistive Element | 300Ω |
| 67 | Variable Reset | 50KΩ |
| 69 | OP Amp | 776 |
| 85 | Transistor | 2N2222 |
| 86 | Transistor | 2N3091 |

Figure 7:
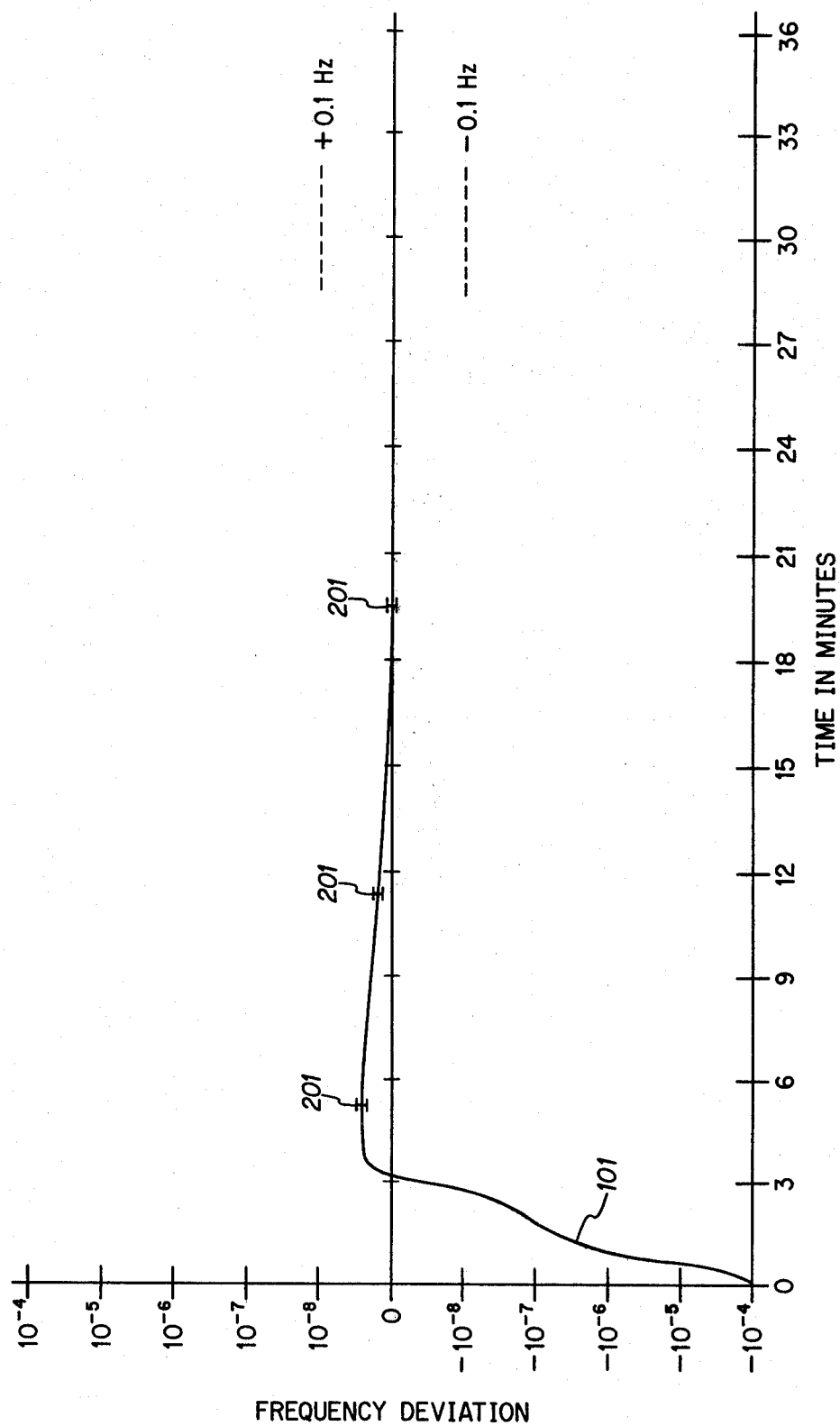

FIG. 7 illustrates the results of a test circuit used in accordance with the invention and illustrates the frequency of the oscillator 81 versus time with the components that are listed within Table 1. The abscissa shows at 0 the desired frequency which in the case of the experimental model was 10.230 MHz. At the expiration of three minutes the specification required that the crystal oscillator be within ±0.1 Hz or one part in $10^{-8}$ as indicated on the graph. The resistors 63 and 64 ceased to have current flowing through them at the expiration of two minutes as shown by curve 101 on the figure due to the fact that transistor 40 was no longer operating within the saturated range. The setting of the resistor 67 in this embodiment was for 39 kohm. Tracks 201 are used to illustrate the spread of the frequency actually measured during the test.

Many changes and modifications in the above described embodiment of the invention can, of course, be carried out without departing from the scope thereof. Accordingly, to promote the progress in the science and useful arts, the invention is disclosed and is intended to be limited only by the scope of the appended claims.

We claim:

1. A crystal oscillator with an accelerated warm-up crystal oven, comprising:
    an oscillator crystal encapsulated within a case;
    an oscillator circuit for the oscillator crystal, the oscillator circuit being thermally mounted to the case and the case being mounted within the accelerated warm up crystal oven;
    connector means for electrically connecting the oscillator circuit across the oscillator crystal;
    controlled heater means for heating the accelerated warm-up crystal oven and crystal oscillator;
    first thermal sensor means for sensing the temperature of the case;
    second thermal sensor means for sensing the temperature of the controlled heater means; and
    control means for controlling the controlled heater means in response to the first and second thermal sensor means.

2. A crystal oscillator with an accelerated warm-up crystal oven according to claim 1 wherein the controlled heater means comprises:
    a first and second thick film resistive network mounted on opposing surfaces of the case.

3. A crystal oscillator with an accelerated warm-up crystal oven according to claim 2 wherein each of the first and second thick film resistive networks comprises:
    a first set of resistive elements electrically joined together for providing a maintenance level of heat sufficient to compensate for heat lost from the crystal oven; and
    a second set of resistive elements electrically joined together having a resistive value less than the first set of resistive elements for providing an accelerating level of heat sufficient to increase the temperature of the crystal oven.

4. The crystal oscillator with an accelerated warm-up crystal oven according to claim 2 wherein the first and second thermal sensors comprise:
    a first thermistor mounted in close proximity to the connector means; and
    a second thermistor mounted on the first thick film resistive network.

5. The crystal oscillator with an accelerated warm-up crystal oven according to claim 3 wherein the control means comprises:
    reference means for providing a reference signal;
    comparator means for comparing the reference signal with a signal that results from the current flow through the first and second thermistor to provide a first heat signal;
    first power amplifier means responsive to the first heat signal for controlling the current flow through the first set of resistive elements to produce heating therefrom;
    switch means for monitoring the first power amplifier means output and to provide a second heat signal; and
    second power amplifier means responsive to the second heat signal for controlling the current flow through the second set of resistive elements to produce heating therefrom.

6. The crystal oscillator with an accelerated warm-up crystal oven according to claim 1 further comprising:
    an electrical means for providing relative weighting of the first thermal sensor and the second thermal sensor.

7. The crystal oscillator with an accelerated warm-up crystal oven according to claim 6 wherein the electrical means comprises:
    a shunting resistor across the first thermal sensor.

8. A method for controlling the temperature of an oscillator crystal encapsulated within a case and connected across an oscillator circuit to form a crystal oscillator and in which the overall assembly is mounted in a crystal oven, the method comprising the steps of;
    heating the oven and the crystal oscillator;
    sensing the temperature of the case;
    sensing the temperature of the oven; and
    controlling the heating of the crystal oscillator and the oven in response to the results of the steps of sensing the temperature of the case and sensing the temperature of the oven.

* * * * *